(12) United States Patent
Jordan et al.

(10) Patent No.: US 6,879,048 B2
(45) Date of Patent: Apr. 12, 2005

(54) GLASS FRIT WAFER BONDING PROCESS AND PACKAGES FORMED THEREBY

(75) Inventors: Larry Lee Jordan, Kokomo, IN (US); Douglas A. Knapp, Tipton, IN (US)

(73) Assignee: Delphi Technologies, Inc., Troy, MI (US)

( * ) Notice: Subject to any disclaimer, the term of this patent is extended or adjusted under 35 U.S.C. 154(b) by 13 days.

(21) Appl. No.: 10/382,249

(22) Filed: Mar. 5, 2003

(65) Prior Publication Data

US 2003/0157426 A1 Aug. 21, 2003

Related U.S. Application Data

(62) Division of application No. 09/773,959, filed on Feb. 2, 2001, now Pat. No. 6,537,892.

(51) Int. Cl.[7] ............................................. H01L 29/40
(52) U.S. Cl. ........................ 257/778; 257/779; 257/772; 438/108; 438/612
(58) Field of Search ................................ 257/778–779, 257/772; 438/108, 612

(56) References Cited

U.S. PATENT DOCUMENTS

| | | | |
|---|---|---|---|
| 5,388,443 A | 2/1995 | Manaka | 73/31.06 |
| 6,062,461 A | 5/2000 | Sparks et al. | 228/123.1 |
| 6,232,150 B1 * | 5/2001 | Lin et al. | 438/119 |
| 2003/0157426 A1 * | 8/2003 | Jordan et al. | 430/200 |

* cited by examiner

Primary Examiner—Dung A. Le
(74) Attorney, Agent, or Firm—Stefan V. Chmielewski

(57) ABSTRACT

A method of glass frit bonding wafers to form a package, in which the width of the glass bond line between the wafers is minimized to reduce package size. The method entails the use of a glass frit material containing a particulate filler material that establishes the stand-off distance between wafers, instead of relying on discrete structural features on one of the wafers dedicated to this function. In addition, the amount of glass frit material used to form the glass bond line between wafers is reduced to such levels as to reduce the width of the glass bond line, allowing the overall size of the package to be minimized. To accommodate the variability associated with screening processes when low volume lines of paste are printed, the invention further entails the use of storage regions defined by walls adjacent the glass bond line to accommodate excess glass frit material without significantly increasing the width of the bond line. The storage regions also ensure adequate flow of glass frit material around electrical runners that cross the glass bond line, as well as into any isolation trenches surrounding the runners.

10 Claims, 1 Drawing Sheet

GLASS FRIT WAFER BONDING PROCESS AND PACKAGES FORMED THEREBY

This application is Div of Ser. No. 09/773,959 Feb. 2, 2001 U.S. Pat. No. 6,537,892.

TECHNICAL FIELD

The present invention generally relates to wafer bonding methods. More particularly, this invention relates to a wafer bonding process that uses a glass frit bonding material to bond a pair of wafers and form a package with an enclosed cavity, wherein the stand-off distance between the wafers is controlled by the bonding material and the width of the bonding surface contacted by the bonding material is minimized to reduce package size.

BACKGROUND OF THE INVENTION

Within the semiconductor industry, there are numerous applications that require bonding a semiconductor wafer to a second wafer or glass substrate. As an example, a microelectromechanical system (MEMS) device formed in or on a semiconductor wafer (referred to herein as a device wafer) is often capped by a semiconductor or glass wafer (referred to herein as a capping wafer), forming a package that defines a cavity within which the MEMS device is enclosed and protected. Examples of MEMS devices protected in this manner include accelerometers, rate sensors, actuators, pressure sensors, etc. By the very nature of their operation, MEMS devices must be free to move to some degree, necessitating that the seal between the wafers is sufficient to exclude foreign matter from the cavity. Certain MEMS devices, such as absolute pressure sensors, further require that the cavity be evacuated and hermetically sealed. The performance of motion sensors with resonating micromachined components also generally benefit if the cavity is evacuated so that the micromachined components operate in a vacuum. A hermetical seal also ensures that moisture is excluded from the cavity, which might otherwise form ice crystals at low temperatures that could impede motion of the MEMS device.

In view of the above, the integrity of the bond that secures the capping wafer to the device wafer is essential to the performance and life of the enclosed MEMS device. Various bonding techniques have been used for the purpose of maximizing the strength and reliability of the wafer bond, as well as various intermediate bonding materials, including adhesives, solders, and dielectrics such as glass frit. Silicon direct and anodic bonding techniques that do not require an intermediate material have also been used. As would be expected, each of these bonding techniques can be incompatible or less than ideal for certain applications. Silicon direct and anodic bonding methods require very smooth bonding surfaces, and therefore cannot produce a vacuum seal when trench isolation or unplanarized metal crossunders are employed on the device wafer, such as to electrically interconnect a MEMS device to bond pads outside the vacuum-sealed cavity of the package. In contrast, intermediate bonding materials such as glass frit are able to form suitable bonds with deposited layers, runners and other surface discontinuities often found on device wafers.

Glass frit bonding materials used for wafer bonding are often deposited by a screen printing technique, in which case the material is deposited as a paste that contains a glass frit, a thixotropic binder, and a solvent for the binder. The proportions of glass frit, binder and solvent are adjusted to allow screen printing of a controlled volume of the paste on a designated bonding surface of one of the wafers, typically on the capping wafer. After firing to remove the binder and solvent, the capping and device wafers are aligned and then mated so that the remaining glass frit particles (bonded together as a result of the firing operation) contact a complementary bonding surface of the second (e.g., device) wafer. The wafers are then heated to melt the glass frit (e.g., about 425° C), so that on cooling the glass frit material resolidifies to form a substantially homogeneous glass bond line between the wafers.

While a certain bond line width is necessary to form a sufficiently strong wafer bond, minimizing the width of the bond line is desirable from the standpoint of reducing the chip size, which in turn enables the maximum number of chips to be fabricated on a wafer slice. The minimum width and volume of a screen printed glass bond line is not typically limited by concerns for bond strength, but by the capability of the screen printing process. Because of an unacceptable variability of screening processes when thin and narrow lines of paste are printed, the volume of glass frit paste printed is typically greater than that required to effect a reliable hermetic wafer bond. To control the "stand-off" distance between wafers, the final thickness of the glass bond line may be established by "stand-offs" micromachined in one of the wafers. When the capping and device wafers are mated, pressure is applied to bring the stand-offs into contact with the surface of the device wafer, thus physically establishing the wafer spacing. Consequently, both wafers must have surfaces dedicated to accommodating the stand-offs, increasing the chip size. The excess bond material is forced outward relative to the original printed bond line, leading to a relatively wide bond line that must be accommodated by the respective bonding surfaces oil the wafers. As a result, relatively wide bond lines and micromachined stand-offs associated with current glass bonding techniques have artificially limited the size to which wafer bonded chip packages can be reduced.

In view of the above, it would be desirable if an improved wafer bonding process were available that could reduce the widths of the wafer bonding surfaces in order to maximize the chip multiple per wafer slice. It would be further desirable if such a process could simplify wafer fabrication while reducing package cost.

SUMMARY OF THE INVENTION

The present invention provides a method for glass frit bonding wafers to form a package, in which the width of the glass bond line is minimized to reduce package size. A particular example is the capping of a device wafer to enclose a micromachined sensing structure, such as a MEMS device. The invention entails the use of a glass frit material that establishes the stand-off distance between wafers, instead of relying on discrete structural features on one of the wafers dedicated to this function. In addition, the amount of glass frit material used to form the glass bond line between wafers is reduced to such levels as to reduce the bond line width, allowing the overall size of the package to be minimized. To accommodate the variability associated with screening processes when low volume lines of paste are printed, the invention further entails the use of storage cavities adjacent the bond line to accommodate excess glass frit material without significantly increasing the width of the bond line.

The method of this invention generally entails providing a paste that comprises, in addition to a glass frit material for the glass bonding process, a particulate filler material having a higher melting temperature than the glass frit material and a diametrical dimension corresponding to the stand-off distance desired between the wafers to be bonded. The paste is deposited on a bonding surface of a first wafer so as to define a bond line thereon, and the first wafer is then heated at least sufficiently to remove any volatile constituents of the paste. The first wafer is then mated with a second wafer so that the bond line is between and contacts bonding surfaces of both wafers. As a result of the diametrical dimension of the particulate filler material, the stand-off distance between the bonding surfaces of the wafers is approximately equal to the diametrical dimension of the filler material. The wafers are then sufficiently heated to melt the glass frit material but not the filler material, and then cooled to form a glass bond line between the wafers, at which time the bonding surfaces of the wafers remain approximately spaced apart by the stand-off distance established by the filler material.

According to a preferred aspect of the invention, at least one storage area defined by a cavity, trench, etc., is present in the surface of the first wafer, and the paste is printed on the bonding surface of the first wafer adjacent the storage area so that any excess portion of the paste flows into the storage area during the mating step. The paste is also preferably printed adjacent a peripheral edge of the first wafer, so that any additional excess portion of the paste flows beyond the peripheral edge when the wafers are mated together. The storage area and peripheral edge are preferably defined by respective walls contiguous but not perpendicular to the bonding surface of the first wafer. As a result, the portions of the paste that flow into the storage area and beyond the peripheral edge flow along the sloping walls away from the second die, such that these portions have a relatively large combined volume, preferably greater than the volume of the remainder of the paste remaining between the bonding surfaces, the storage area and the peripheral edge.

Using the method of this invention, the width of a glass bond line can be significantly reduced, thereby reducing the width of the bonding surfaces required to accommodate the bond line. In addition, the fabrication of a device package can be simplified by eliminating the need for micromachined structures to physically establish the stand-off between wafers. As a result, the package size can be reduced and the number of packages that can be fabricated on a given wafer increased. Though minimizing the width of the bond line, the present invention enables a sufficient amount of bonding material to be available to fill any trenches or other surface discontinuities present in the surface of the wafers, while any excess bonding material is accommodated while having minimal impact on the bond line width. Accordingly, the wafer bonding process of the present invention is able to yield a highly reliable package containing a MEMS device that can be hermetically sealed within the package, while also reducing the cost of the package.

Other objects and advantages of this invention will be better appreciated from the following detailed description.

DESCRIPTION OF THE PREFERRED EMBODIMENTS

Figure 1:
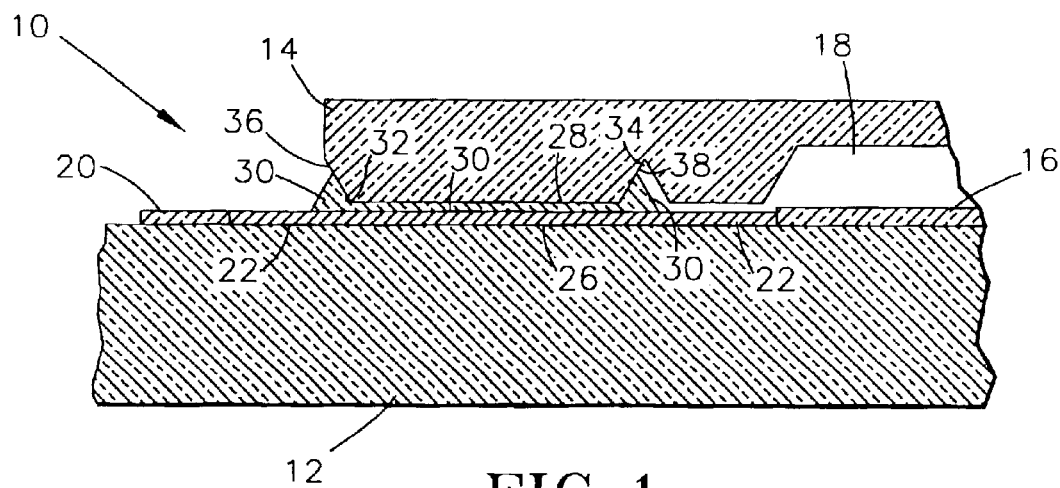
FIG. 1 is a cross-sectional view of an edge of a MEMS device package that includes a capping wafer glass frit bonded to a device wafer in accordance with this invention.

FIG. 1 represents a portion of a MEMS device package 10 that has been glass frit bonded in accordance with this invention. The package 10 is formed by bonding a device wafer 12 to a capping wafer 14, such that a micromachined structure 16 (schematically represented in FIG. 2) is enclosed within a cavity 18 between the wafers 12 and 14. The wafers 12 and 14 are preferably silicon, and the device wafer 12 preferably monocrystallographic silicon, though it is foreseeable that other materials could be used. For example, the capping wafer 14 can be formed of glass, ceramic, or a semiconducting material other than silicon. The micromachined structure 16 can be of any desired type, such as a proof mass, resonating structure, diaphragm or cantilever that relies on capacitive, piezoresistive and piezoelectric sensing elements to sense acceleration, motion, pressure, etc., all of which are known in the art. A particularly notable example is a MEMS device disclosed in U.S. patent application Ser. No. 09/410,712 to Rich, assigned to the assignee of this invention and incorporated herein by reference.

Figure 2:
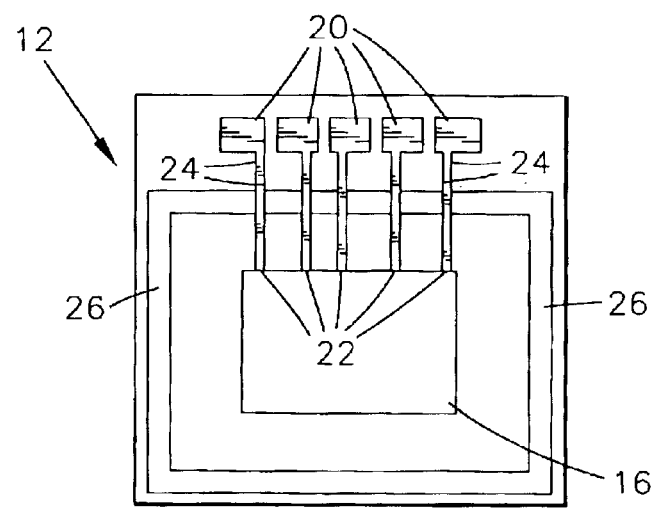
FIGS. 2 and 3 are plan views of the device and capping wafers, respectively, of FIG. 1.

As is conventional, the micromachined structure 16 is electrically interconnected to metal bond pads 20 on the device wafer 12 by conductive runners 22. Through the bond pads 20, the micromachined structure 16 and its associated sensing elements can be electrically interconnected with appropriate signal conditioning circuitry (not shown), which may be formed on the device wafer 12, the capping wafer 14 or a separate chip. The runners 22 are represented in FIG. 2 as being isolated by trenches 24 from the surrounding substrate surface of the device wafer 12. As also shown in FIG. 2, the runners 22 and their corresponding trenches 24 cross through a bonding surface 26 contacted by a glass bond line 30 (FIG. 1) that bonds a corresponding bonding surface 28 of the capping wafer 14 to the bonding surface 26 of the device wafer 12. The distance between the bonding surfaces 26 and 28 of the wafers 10 and 12 is referred to herein as the stand-off height, and is important from the perspective of providing adequate clearance and, if applicable, damping control for the micromachined structure 16 within the cavity 18, as well as to establish a predetermined space between the wafers 10 and 12 that can be filled with a substantially consistent amount of glass among the packages singulated from a single wafer.

Figure 3:
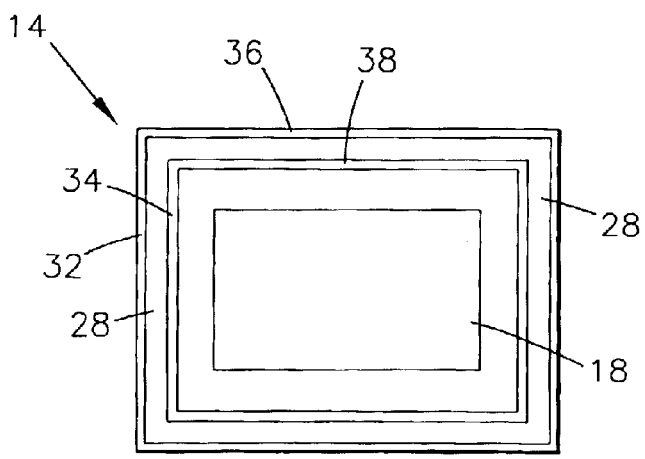

In FIGS. 1 and 3, the capping wafer 14 is portrayed as being etched or otherwise fabricated to have a peripheral edge 32 and a trench 34 separated by the bonding surface 28. The trench 34 is spaced inwardly a preferably uniform distance from the peripheral edge 32, and is continuous so that the bonding surface 28 is also continuous and complementary to the bonding surface 26 of the device wafer 12. For reasons to be explained below, the edge 32 and trench 34 of the capping wafer 14 are defined by respective walls 36 and 38 that are contiguous with the bonding surface 28 of the capping wafer 14. The walls 36 and 38 are shown as being oblique to the bonding surface 28 of the capping wafer 14. In one example, the walls 36 and 38 are fabricated to be disposed at an angle of about 54.7 degrees to the bonding surface 28 by forming the capping wafer 14 of 1,0,0 silicon, and anisotropically etching the peripheral edge 32 and trench 34 with an appropriate etchant, suitable examples of which include alkali-type wet etchants such as potassium hydroxide (KOH) and tetramethyl ammonium hydroxide (TMAH), and pyrocatechol ethylenediamine. However, for reasons to become apparent, it is believed that suitable results could be obtained if the walls 36 and 38 are sloped at greater or lesser angles, including perpendicular to the bonding surface 28, through the use of different wafer materials and etchants.

According to prior practice, the bond line 30 is preferably formed with a paste composition that includes a glass frit material, a thixotropic binder and a solvent, in which the binder and solvent are removed and the glass frit material is melted by sufficiently heating the paste, with the result that essentially only glass remains as the bond line 30. Suitable binders and solvents for the paste are those used in commercially-available glass frit paste mixtures, such as acrylics for the binder. Suitable solvents and binders generally have vaporization temperatures on the order of about 100° C. and about 300° C., respectively, and therefore well below the softening point of glass frit materials suitable for the paste (e.g., about 355° C.). As known in the art, the proportions of the glass frit material, binder and solvent are chosen at least on part to achieve the desired deposition resolution for the paste, and consequently, the minimum width and thickness of the glass bond line 30. A preferred deposition method is screen printing in accordance with known practices, by which the paste is deposited through a mask or screen to form a thick film on the bonding surface 26 or 28 of one of the device or capping wafers 10 or 12. The paste is typically loaded onto the mask, and a squeegee blade is drawn across the surface of the mask to press the paste through apertures onto the bonding surface 26 or 28. Thick films can be accurately printed by screen printing to dimensions of about 0.3 mm, with increased variability in width and volume of the thick film typically occurring with decreasing film widths.

According to the invention, the paste is formulated to further include a particulate filler material that has a higher melting temperature than that of the glass frit material. A particularly suitable composition for the filler material is cordierite, though silicon or other higher-melting temperature materials could be used. The size range of a filler material is chosen to have a diametrical size approximately equal to the stand-off distance desired between the device and capping wafers 10 and 12. In a preferred embodiment, the particle size range of the filler material is about four to about six micrometers which, when the preferred bonding process of this invention is employed (as described below), yields a stand-off distance typically in the range of about five to about seven micrometers. The composition and size of the glass frit material can be chosen on the basis of other process and compositional considerations, including screening properties, process temperatures, etc. Suitable glass frit materials include borosilicate glasses, though it is foreseeable that the glass frit could be a mixture of various oxides, such as litharge (PbO; also known as lead oxide, yellow and lead monoxide), boric acid ($H_3BO_3$) which serves as a source for boron oxide ($B_2O_3$), silicon dioxide ($SiO_2$; silica), aluminum oxide ($Al_2O_3$, alumina), titanium oxide ($TiO_2$, titania), cupric oxide (CuO), manganese dioxide ($MnO_2$) or manganese carbonate ($MnCO_3$) as a source for manganous oxide (MnO), calcia (CaO), lithium oxide ($Li_2O$), ceria ($CeO_2$), cobaltous carbonate ($CoCO_3$) and others.

In an exemplary process in accordance with this invention, a glass frit paste is screen printed on the bonding surface 28 of the capping wafer 14 so that the paste defines a continuous bond line between the edge 32 and trench 34 of the capping wafer 14. If the width of the bonding surfaces 26 and 28 is about 300 micrometers, a suitable width for the paste printed on the bonding surface 28 of the capping wafer 14 is about 250 micrometers. In the preferred embodiment, the capping wafer 14 is then heated to remove the solvent and binder from the paste, and thereafter melt the glass frit material so that the bond line now comprises the filler material dispersed in a molten glass material. Heating the wafer 14 to remove the binder and solvent and melt the glass frit material can be performed in separate steps. For example, the binder and solvent can be sequentially removed by firing in an air atmosphere, after which the glass frit material is flowed in a vacuum. In one example, the wafer 14 is baked at about 100° C. to remove the solvent, then baked at about 300° C. to remove the binder, followed by a bake at a temperature of about 340° C. to soften or melt the surfaces of the glass particles, effectively bonding or "tacking" the particles together. The preceding steps may be performed in air, after which the oven is evacuated and the wafer 14 is baked at about 420° C. to completely melt the glass frit material. Though slight devitrification of the glass material during the 420° C. bake may occur, raising the useful softening point of the glass (e.g., from about 355° C. to about 385° C.), this intermediate glass reflow step allows the capping wafer 14 to be handled upon cooling without any significant risk of glass particles being dislodged from the bonding surface 28 and ending up elsewhere on the wafers 12 and 14.

After the glass bonding material has resolidified, the capping and device wafers 12 and 14 are aligned and mated so that the bonding material on the capping wafer 14 contacts the bonding surface 26 of the device wafer 12. The wafers 12 and 14 are then heated to a temperature sufficient to remelt the glass material but not the filler material of the bonding material, e.g., about 420° C., during which time force is applied to the wafers 12 and 14 to cause a portion of the material to flow into the trench 34 of the capping wafer 14, and simultaneously a second portion of the material flows beyond the peripheral edge 34. The remainder of the glass bonding material remains between the bonding surfaces 26 and 28 of the wafers 12 and 14. At this time, the bonding surfaces 26 and 28 of the wafers 12 and 14 remain spaced apart by the stand-off distance established by the particle size of the filler material, which does not melt during the bonding operation. Finally, the wafers 12 and 14 are cooled to resolidify the bonding material and form the glass bond line 30 shown between the wafers 12 and 14 in FIG. 1. According to the invention, the filler material remains dispersed in the glass bond line 30 to establish the desired stand-off distance between the bonding surfaces 26 and 28 of the wafers 12 and 14.

In FIG. 1, the portions of the glass bond line 30 that were forced out between the bonding surfaces 26 and 28 are accommodated within the open volume alongside the edge 32 of the wafer 14 and a storage area defined by the trench 34 in the surface of the wafer 14. In effect, the edge 32 and trench 34 define storage volumes for the molten glass material displaced during the bonding operation. The significance of the sloping edge and trench walls 36 and 38 is related to the desire to minimize the width of the glass bond line 30, which in turn allows the chip size to be reduced and, consequently, enables more device chips to be fabricated in a single wafer slice. The desire to establish the stand-off distance between the wafers 12 and 14 by the diametrical dimension of the particulate filler material results in the dimensions of the screen-printed thick film paste being at the lower limits of the screen printing process, with the result that variability in the thickness and volume of the thick film paste is higher than what can be permitted to produce a reliable and preferably hermetic glass bond. This variability is rectified by providing the storage volumes defined by the edge 32 and trench 34 of the capping wafer 14 for the variable amount of molten glass material that is displaced from between the bonding surfaces 26 and 28 during the bonding operation.

As also seen in FIG. 1, the displaced portions of the bond line 30 acquire a triangular-shaped cross-section as a result of the molten glass material following the sloping surfaces of the walls 36 and 38. In an investigation leading to this invention, the displaced portions of the bond line 30 roughly formed isosceles triangles, the cross-sectional area of which can be predicted for a given wall slope. Assuming a stand-off distance of about 5.5 micrometers and the use of 1,0,0 silicon material anisotropically etched to form the walls 36 and 38 at 54.7 degree angles to the bonding surface 28, the triangular-shaped displaced portions of the bond line 30 have a combined volume that is greater than the remainder of the bond line 30 between the bonding surfaces 26 and 28 if the horizontal offset of each wall 36 and 38 (one-half the base of the triangle) is more than 50 micrometers. Consequently, the sloping peripheral edge 32 and trench 34 of the capping wafer 14 effectively accommodate excess molten glass during the bonding process, and provide efficient storage areas for the excess material of the bond line 30. The width of the bonding surface 28, and therefore the distance between the edge 32 and trench 34 of the capping wafer 14, is preferably selected by determining the minimum required area for the bonding surface 28 based on screen printing and bond strength requirements. In practice, a suitable width for the bonding surface 28 is about 300 to about 450 micrometers, though narrower and wider widths are foreseeable.

While the edge 32 is shown as the outermost extremity of the capping wafer 14 and the trench 34 is shown as also delineating the cavity 18 within the wafer 14, the sloping walls 36 and 38 could be formed with trenches whose sole function is to create the open volumes necessary to accommodate the displaced portions of the bond line 30. Notably, proper trench design includes the ability to prevent air from becoming trapped as the molten glass fills the trenches. For example, the trench 34 is terminated outside, and not under, the bond line 30, to provide a path through which air is able to flow out of the trench 34 as the trench 34 is filled with molten glass.

Referring again to FIG. 2, the runners 22 and isolation trenches 24 present on the device wafer 12 complicate the ability to hermetically seal the cavity 18 of the package 10. An important aspect of the present invention is the ability to insure adequate flow of molten glass material around the runners 22 and into the trenches 24 as a result of the glass bonding material "stored" in the storage areas defined by the trench 34 and edge 32, and also in part by the preferred reflow step prior to wafer alignment and bonding. As with the trenches 34, the isolation trenches 24 are preferably fabricated so that air will escape from the trenches 24 during bonding. The location and size of the storage volumes defined by the trench 34, edge 32 and their walls 36 and 38 must be sufficient to accommodate an excess amount of molten glass that can fill the trenches 24 without depleting the molten glass between the bonding surfaces 26 and 28. Consequently, the present invention enables the isolation trenches 24 to be filled without resorting to any other trench fill process, such as additional polysilicon growth, screen printing, etc., often required in the past.

In view of the above, the present invention provides a glass frit bonding process by which the size of a device package, such as a MEMS device, can be minimized by eliminating the use of a discrete structural feature to space the wafers apart, and by reducing the bond line width to something closer to the minimum width necessary to effect an airtight seal of adequate strength. In addition, the invention provides the capability of forming a hermetic seal across trenches, runners and other surface discontinuities without any additional and costly trench-fill process. While the invention has been described in terms of preferred aspects, features and materials, it is apparent that other forms could be adopted by one skilled in the art. Accordingly, the scope of the invention is to be limited only by the following claims.

What is claimed is:

1. A package comprising first and second semiconductor wafers having contact surfaces bonded together with a glass bond line, the glass bond line comprising a glass frit material and a particulate filler material dispersed in the glass frit material, the particulate filler material having a higher melting temperature than the glass frit material, the contact surfaces of the first and second wafers being spaced apart by a stand-off distance established by a diametrical dimension of the particulate filler material within the glass bond line.

2. A package comprising a capping wafer and a device wafer bonded together with a glass bond line so as to enclose a micromachined device formed on the device wafer, the capping wafer having a peripheral edge and a trench in a surface thereof, the trench being spaced inwardly from the peripheral edge so as to define a bonding surface therebetween, the device wafer having a bonding surface facing the bonding surface of the capping wafer, the bonding surfaces of the device and capping wafers being continuous and surrounding the micromachined device, the glass bond line having a first portion in the trench of the capping wafer, a second portion beyond the peripheral edge of the capping wafer, and a remaining portion between the bonding surfaces of the device and capping wafers, the glass bond line comprising a glass frit material and a particulate filler material dispersed in the glass frit material, the particulate filler material having a higher melting temperature than the glass frit material and having a diametrical dimension that establishes a stand-off distance between the bonding surfaces of the capping and device wafers.

3. A package according to claim 1, further comprising a storage area in the first wafer, the glass bond line being adjacent the storage area with a first portion thereof being present in the storage area.

4. A package according to claim 3, wherein the first wafer has a peripheral edge and a second portion of the glass bond line extends beyond the peripheral edge.

5. A package according to claim 4, wherein the first and second portions of the glass bond line have a greater volume than a remainder of the glass bond line between the storage area and the peripheral edge.

6. A package according to claim 1, wherein the diametrical dimension of the particulate filler material is about four to about six micrometers.

7. A package according to claim 2, wherein the trench and the peripheral edge of the capping wafer are defined by respective walls contiguous with the bonding surface of the capping wafer, and wherein the walls are oblique to the bonding surface of the capping wafer.

8. A package according to claim 7, wherein each of the first and second portions of the glass bond line has a triangular cross-section.

9. A package according to claim 8, wherein the first and second portions of the glass bond line have a combined volume that is greater than the remainder of the glass bond line between the bonding surfaces of the device and capping wafers.

10. A package according to claim 2, wherein the diametrical dimension of the particulate filler material is about four to about six micrometers.

* * * * *